United States Patent
Lee et al.

(10) Patent No.: US 10,787,736 B2
(45) Date of Patent: Sep. 29, 2020

(54) POLYSILICON MANUFACTURING APPARATUS

(71) Applicant: HANWHA CHEMICAL CORPORATION, Seoul (KR)

(72) Inventors: Hee Dong Lee, Seoul (KR); Ji Ho Kim, Suncheon-si (KR); Sung Eun Park, Yeosu-si (KR); Hyo Jin Jeon, Seoul (KR)

(73) Assignee: HANWHA CHEMICAL CORPORATION, Seoul (KR)

( * ) Notice: Subject to any disclaimer, the term of this patent is extended or adjusted under 35 U.S.C. 154(b) by 0 days.

(21) Appl. No.: 16/473,288

(22) PCT Filed: Dec. 27, 2017

(86) PCT No.: PCT/KR2017/015544
§ 371 (c)(1),
(2) Date: Jun. 25, 2019

(87) PCT Pub. No.: WO2018/124730
PCT Pub. Date: Jul. 5, 2018

(65) Prior Publication Data
US 2020/0002808 A1    Jan. 2, 2020

(30) Foreign Application Priority Data

Dec. 29, 2016   (KR) ........................ 10-2016-0182920

(51) Int. Cl.
*C23C 16/24* (2006.01)
*C01B 33/035* (2006.01)
(Continued)

(52) U.S. Cl.
CPC ............. *C23C 16/24* (2013.01); *B01J 19/002* (2013.01); *C01B 33/035* (2013.01); *C23C 16/45563* (2013.01)

(58) Field of Classification Search
CPC . C23C 16/24; C23C 16/455; C23C 16/45563; C23C 16/45578; C23C 16/4405; B01J 19/002
See application file for complete search history.

(56) References Cited

U.S. PATENT DOCUMENTS 8,557,210 B2   10/2013   Fabry et al.
8,722,141 B2    5/2014   Weidhaus et al.
(Continued)

FOREIGN PATENT DOCUMENTS

CN   101759186   6/2010
CN   105217636   1/2016
(Continued)

OTHER PUBLICATIONS

WIPO, A PCT Search Report & Written Opinion of PCT/KR2017/015544 dated Apr. 6, 2018.

Primary Examiner — Lessanework Seifu
(74) Attorney, Agent, or Firm — Lex IP Meister, PLLC

(57) ABSTRACT

A polysilicon manufacturing apparatus according to an exemplary embodiment of the present invention includes: a reactor in which a reactive gas is introduced to perform a polysilicon manufacturing process by a chemical vapor deposition (CVD) method; and a slit-type nozzle installed at the reactor and spraying a gas inside the reactor to prevent absorption of silicon particles during a process.

5 Claims, 3 Drawing Sheets

(51) Int. Cl.
*B01J 19/00* (2006.01)
*C23C 16/455* (2006.01)

(56) References Cited

U.S. PATENT DOCUMENTS

| | | | |
|---|---|---|---|
| 8,821,827 B2 | 9/2014 | Kim et al. | |
| 2008/0095953 A1* | 4/2008 | Lee | C23C 16/45578 |
| | | | 427/569 |
| 2016/0168704 A1* | 6/2016 | Choi | C23C 16/45546 |
| | | | 156/345.33 |

FOREIGN PATENT DOCUMENTS

| | | |
|---|---|---|
| JP | 2005-197373 | 7/2005 |
| KR | 10-0411180 | 12/2003 |
| KR | 10-0767762 | 10/2007 |
| KR | 10-2007-0119328 | 12/2007 |
| KR | 10-0783667 | 12/2007 |
| KR | 10-2012-0086422 | 8/2012 |
| KR | 10-2014-0048034 | 4/2014 |
| KR | 10-2014-0093724 | 7/2014 |

\* cited by examiner

POLYSILICON MANUFACTURING APPARATUS

TECHNICAL FIELD

The present invention relates to a polysilicon manufacturing apparatus. More particularly, the present invention relates to a polysilicon manufacturing apparatus generating silicon particles in a reactor during a chemical vapor deposition (CVD) process.

BACKGROUND ART

A Siemens chemical vapor deposition (CVD) reactor is a key part of a polysilicon manufacturing process, and is batch process equipment. The chemical vapor deposition (CVD) method is a method in which a silicon filament is installed in a Siemens CVD reactor, resistance heat is generated by applying electric power, and a reaction gas is injected in a high pressure condition for 60 to 80 hours to produce a silicon rod with a diameter of 120-150 mm.

In the deposition process, a deposition reaction occurs at the silicon rod surface, however silicon particles are generated in a gas flow in the reactor or a high temperature region of the gas generated according to the structure of the reactor or the silicon rod. The silicon particles cause productivity deterioration.

Therefore, it is necessary to control the generation of the silicon particles and to remove them so as to not affect the process.

In Korean Patent Laid-Open Publication No. 2014-0048034, in order to solve the problem caused by the silicon particles, after the deposition process, a mixed gas of HCl or HCl, and $H_2$, is injected to etch and remove the silicon particles adsorbed on the reactor inner wall. However, this method reduces a production amount of polysilicon because the surface of the silicon rod is etched while removing the silicon particles.

That is, in the silicon deposit process, the silicon particles formed in the gas flow or the high temperature region of the gas in the reactor generated according to the structure of the reactor or the silicon rod are absorbed to the inner wall, the bottom, and the electrode cover of the reactor. As a result, the production amount of the polysilicon is deteriorated, and the manufacturing cost of the polysilicon is increased.

Specifically, the silicon particles absorbed on the inner wall of the reactor reduce reflectance of radiation energy, and radiation heat loss increases the manufacturing cost. The silicon particles adsorbed on the reactor bottom and the electrode cover cause a process interruption due to electric leakage, resulting in loss of the production amount. Finally, the adsorbed silicon particles increase the time required for the cleaning process after the end of the operation, resulting in productivity deterioration. Therefore, the adsorption of the silicon particles inside the reactor increases economic loss.

DISCLOSURE

The present invention provides a polysilicon manufacturing apparatus that suppresses silicon particles generated during a process from being absorbed to the inside of the reactor in a CVD reactor for polysilicon production.

A polysilicon manufacturing apparatus according to an exemplary embodiment of the present invention includes: a reactor in which a reactive gas is introduced to perform a polysilicon manufacturing process by a chemical vapor deposition (CVD) method; and a slit-type nozzle installed at the reactor and spraying a gas inside the reactor to prevent absorption of silicon particles during a process.

The slit-type nozzle may be installed on at least one of an inner wall and a bottom of the reactor.

The slit-type nozzle installed on the bottom may have a pair of slits opening in opposite directions to each other so as to spray the gas in left and right directions parallel to the bottom with a predetermined separation distance from the bottom.

The slit-type nozzle installed on the inner wall may have a pair of slits opening in opposite directions to each other so as to spray the gas in up and down directions parallel to the inner wall with a predetermined separation distance from the inner wall.

The slit-type nozzle may be provided in plural on the inner wall of the reactor, and a plurality of slit-type nozzles may include two set nozzles and a single nozzle to form an alternating disposition with an equal interval along the circumference of the reactor.

One slit-type nozzle of the set nozzles may be separated from the bottom by a first height, and the other slit-type nozzle may be separated with a first interval along a height direction of the reactor at the first height.

The single nozzle may be separated from the bottom by a second height that is higher than the first height and may be separated with a second interval along a diagonal direction with the set nozzles.

In the slit-type nozzle, the slit interval may be set to 1 mm or less according to the process condition, and the gas spraying speed may be set to 100 m/s or more in the slit.

The gas may include $H_2$ or HCl.

The slit-type nozzle may spray the gas after 60 hours of operation time in which the silicon particles are generated in a large amount, and may spray the gas periodically or continuously during the process.

At the inner wall of the reactor, when the slit-type nozzle periodically sprays the gas, the periodic spraying may spray the gas after the deposition process of 60 hours for 10 minutes with an interval of 1 hour.

At the bottom of the reactor, when the slit-type nozzle periodically sprays the gas, the periodic spraying may spray the gas after the deposition process of 60 hours for 10 minutes with an interval of 30 minutes.

The slit-type nozzle may be formed of one material among Incoloy 800H, Incoloy 800, SS316L, SS316, and Hastelloy.

As above-described, as an exemplary embodiment of the present invention adds the slit-type nozzle to the reactor, when a large amount of the silicon particles is generated after a predetermined time (for example, 60 hours), by spraying the gas suppressing the absorption of the silicon particles, it is possible to effectively prevent the silicon particles from being adsorbed inside the reactor.

MODE FOR INVENTION

Figure 1:
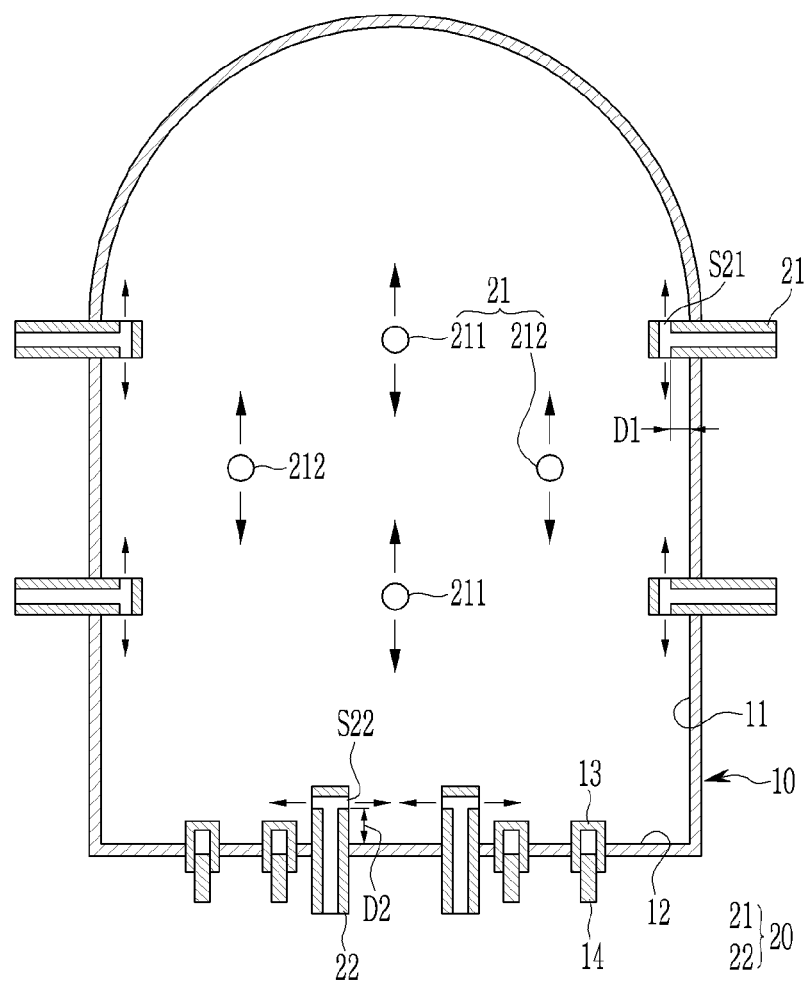
FIG. 1 is a cross-sectional view of a polysilicon manufacturing apparatus according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention. The drawings and description are to be regarded as illustrative in nature and not restrictive. Like reference numerals designate like elements throughout the specification.

Throughout the specification and the claims that follow, when it is described that an element is "coupled" to another element, it includes not only a case in which the element is "directly connected" to the other element but also a case in which the element is "electrically connected" to the other element having another member disposed therebetween. In addition, unless explicitly described to the contrary, the word "comprise" and variations such as "comprises" or "comprising" will be understood to imply the inclusion of stated elements but not the exclusion of any other elements.

FIG. 1 is a cross-sectional view of a polysilicon manufacturing apparatus according to an exemplary embodiment of the present invention. Referring to FIG. 1, the polysilicon manufacturing apparatus of an exemplary embodiment includes a reactor 10 and a slit-type nozzle 20. The slit-type nozzle 20 does not affect the purity of the polysilicon produced.

As an example, the reactor 10 employs a Siemens CVD reactor to produce polysilicon. The reactor 10 is configured to perform a process of producing polysilicon by a CVD (chemical vapor deposition) method by injecting trichlorosilane ($SiHCl_3$, TCS) as a main reaction gas. Silicon particles are generated in the reactor 10 in the process of producing polysilicon.

In the silicon deposit process, the high temperature region in the reactor 10 occurs differently depending on a gas flow or the structure of the reactor 10 or a silicon rod (not shown). The silicon particles are generated in the high temperature region of the gas generated in the reactor 10. The silicon particles may be adsorbed on an inner wall 11, a bottom 12, and an electrode cover 13 of the reactor 10. The adsorption of the silicon particles leads to a large economic loss.

In order to reduce this economic loss, the slit-type nozzle 20 is installed in the reactor 10 and injects the gas into the reactor 10, thereby preventing and suppressing the adsorption of the silicon particles in the reactor 10.

The gas sprayed by the slit-type nozzle 20 may be $H_2$, HCl, or a mixed gas. The gas suppresses the adsorption of the silicon particles in the reactor 10, thus improving the productivity of the polysilicon and reducing the manufacturing cost.

In the case of using $H_2$ as the injection gas, a part of the reaction gas injected to reduce energy consumption may be used to suppress the adsorption of silicon particles. Also, when using HCl as the spraying gas, the HCl may etch the adsorbed silicon particles and remove impurities from the surface of a polysilicon product.

The slit-type nozzle 20 is installed at least one of the inner wall 11 and the bottom 12 of the reactor 10. The present exemplary embodiment is configured to prevent the silicon particles from being adsorbed to the inner wall 11 and the bottom 12 by installing slit-type nozzles 20, 21, and 22 on the inner wall 11 and the bottom 12.

An electrode 14 is provided at the bottom 12 of the reactor 10 to supply power to a silicon rod (not shown) for the deposition reaction. The electrode cover 13 is provided at the electrode 14 on the inside of the reactor 10 to cover the electrode 14, thereby protecting the electrode 14 from an internal environment of the reactor 10.

The slit-type nozzle 22 installed at the bottom 12 has a pair of slits S22 opening in opposite directions to each other so as to spray the gas in left and right directions parallel to the bottom 12 while having a predetermined separation distance D2 for the bottom 12.

Therefore, the gas sprayed from the slit S22 of the slit-type nozzle 22 is sprayed in the left and right directions parallel to the bottom 12, so that the absorption of the silicon particles to the bottom 12 and the electrode cover 13 may be suppressed and prevented. That is, the slit-type nozzle 22 installed at the bottom 12 may allow the electrode 14 and the electrode cover 13 to prevent process interruptions due to electrical leakage.

The slit-type nozzle 21 installed at the inner wall 11 has a pair of slits S21 opening in opposite directions to each other so as to spray the gas in left and right directions parallel to the inner wall 11 while having a predetermined separation distance D1 from the inner wall 11.

Therefore, the gas sprayed from the slit S21 of the slit-type nozzle 21 is sprayed in the up and down directions parallel to the inner wall 11, thereby suppressing and preventing the absorption of the silicon particles on the inner wall 11. That is, the slit-type nozzle 21 installed at the inner wall 11 may prevent the reduction of the reflectance of the radiation energy in the inner wall 11. In addition, the slit-type nozzle 21 installed at the inner wall 11 reduces the heat loss, thereby reducing the manufacturing cost.

Figure 2:
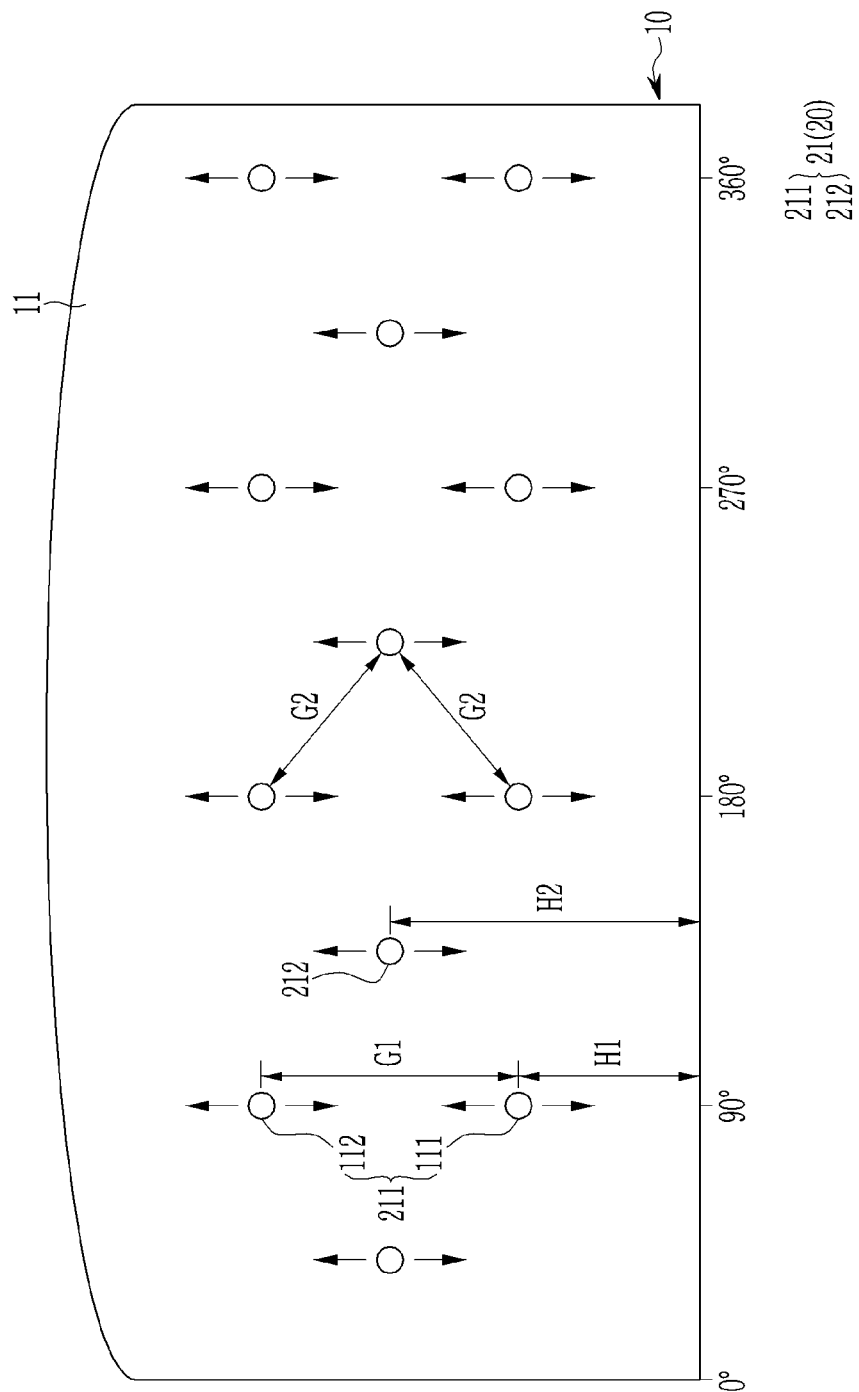
FIG. 2 is a developed view showing a distribution of a slit-type nozzle in a state where a reactor is expanded in the apparatus for producing polysilicon of FIG. 1.

FIG. 2 is a developed view showing a distribution of a slit-type nozzle in a state where a reactor is expanded in the apparatus for producing polysilicon of FIG. 1. Referring to FIG. 1 and FIG. 2, the slit-type nozzle 21 is provided in plural at the inner wall 11 of the reactor 10.

This plurality of slit-type nozzles 21 includes two set nozzles 211 and one single nozzle 212 so as to form an alternating arrangement with an equal interval along the circumferential direction of the reactor 10. Therefore, the plurality of slit-type nozzles 21 may alternately spray the gas from the set nozzle 211 and the single nozzle 212 along the circumferential direction.

One slit-type nozzle 111 of the set nozzle 211 is spaced from the bottom 12 with the first height H1 and another slit-type nozzle 112 is spaced with the first interval G1 along the height direction of the reactor 10 at the first height H1. Therefore, the slit-type nozzles 111 and 112 forming the set nozzle 211 spray the gas upward and downward in the height direction at the first height H1 while maintaining the first interval G1. That is, the slit-type nozzles 111 and 112 may prevent and suppress the adsorption of the silicon particles by spraying the gas in the whole region of the height direction of the reactor 10.

The single nozzle 212 is spaced from the bottom 12 at the second height H2 and is spaced from the set nozzle 211 with the second interval G2 along the diagonal direction. The second height H2 is higher than the first height H1 from the bottom 12. Thus, the single nozzle 212 sprays the gas up and down in the height direction at the second height H2 while maintaining the second interval G2 of the diagonal direction for the slit-type nozzles 111 and 112 forming the set nozzle 211. That is, the single nozzle 212 sprays the gas at the position away from the slit-type nozzles 111 and 112 in the circumferential direction and height direction of the reactor 10 so that it is possible to further prevent and suppress the adsorption of the silicon particles in the portion where the adsorbability of the silicon particles is high.

The slit-type nozzle 20 provided at the bottom 12 and the inner wall 11 sprays the gas after an operation time (for example, 60 hours) during which a large amount of the silicon particles is generated during the operation of the reactor 10, and the gas may be periodically or continuously sprayed to prevent the silicon particles from being deposited and absorbed on the inner wall 11, the bottom 12, and the electrode cover 13 of the reactor 10.

That is, the slit-type nozzle 20 sprays the gas when the silicon particles are likely to be adsorbed to the reactor 10 due to a large amount of the generated silicon particles. The time and period that the slit-type nozzle 20 sprays the gas may be changed depending on the structure of the reactor 10 and the operation time at which a large amount of silicon particles are generated.

The installed slit-type nozzle 21 may periodically spray the gas at the inner wall 11 of the reactor 10. In this case, the periodic spraying of the gas may suppress the adsorption of the silicon particles on the inner wall 11 by spraying the gas for 10 minutes with an interval of 1 hour after 60 hours of the deposition process.

The installed slit-type nozzle 22 may periodically spray the gas at the bottom 12 of the reactor 10. In this case, the periodic spraying of the gas may suppress the adsorption of the silicon particles on the bottom 12 and the electrode cover 13 by spraying the gas for 10 minutes with the 30 minute interval after 60 hours of the deposition process.

In this way, the spraying of the gas proceeds after 60 hours of the operation of the reactor 10, and the spraying cycle is different between the inner wall 11 and the bottom 12. That is, the slit-type nozzle 21 of the inner wall 11 may be set with the spraying period of 1 hour and the spraying time of 10 minutes. The slit-type nozzle 22 of the bottom 12 may be set with the spraying period of 30 minutes and the spraying time of 10 minutes.

The silicon rod, the electrode cover 13, and the like are provided at the bottom 12 so that the possibility of the adsorption of the silicon particles may be larger than that of the inner wall 11. Accordingly, the spraying period of the slit-type nozzle 22 of the bottom 12 is set to be shorter than the spraying period of the slit-type nozzle 21 of the inner wall 11.

Thus, due to the gas spraying of the slit-type nozzles 21 and 22, the reduction of the reflectance of the radiation energy of the inner wall 11 of the reactor 10 is suppressed, thereby reducing the radiation loss, and suppressing the possibility of electrical leakage at the electrode cover 13 of the bottom 12, and the polysilicon productivity may be increased due to the shortened cleaning time after the end of the process.

In addition, on a process characteristic using a lot of electricity, an electricity basic unit is an important element determining a sales price of polysilicon. Due to the power reduction, the electricity basic unit is reduced by about 5% such that competitiveness may be improved.

Figure 3:
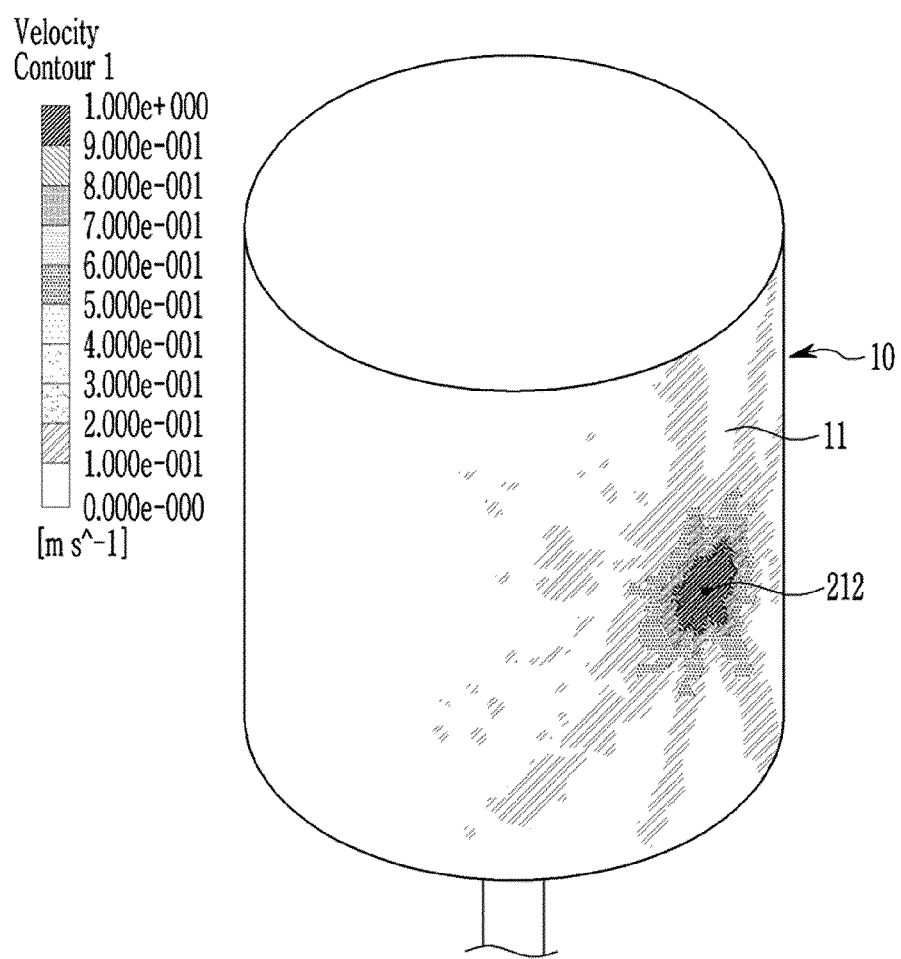
FIG. 3 is a perspective view showing relationship between a speed distribution of a gas sprayed through a slit-type nozzle and a three-dimensional shape of a reactor in a polysilicon manufacturing apparatus of FIG. 1.

FIG. 3 is a perspective view showing a relationship between a speed distribution of a gas sprayed through a slit-type nozzle and a three-dimensional shape of a reactor in a polysilicon manufacturing apparatus of FIG. 1. Referring to FIG. 3, the slit-type nozzle 20 variably sets the interval of the slits S21 and S22 to 1 mm or less according to the process condition, and sets the spraying speed of the gas to 100 m/s or more in the slits S21 and S22.

For example, when the gas is sprayed from the single nozzle 212, a maximum speed distribution is formed at the center of the up and down direction of the inner wall 11, and a speed distribution that gradually decreases from the center toward the up and down directions is formed.

Again referring to FIG. 2, the single nozzle 212 is disposed in the center of the diagonal direction of four set of nozzles 211 disposed in the circumferential direction and up and down directions to spray the gas, thereby suppressing the absorption of the inner wall 11 of the silicon particles. Thus, the single nozzle 212 with four set nozzles 211 forms the uniform speed distribution of the gas spraying over the entire inner wall 11 of the reactor 10, thus substantially uniformly suppressing the adsorption of the inner wall 11 of the silicon particles.

The number and arrangement of the slit-type nozzles 20 may vary depending on the structure of the reactor 10 and does not affect the purity of the polysilicon product. The slit-shaped nozzle 20 may have stability at a high temperature of 1000° C. or higher, may have excellent corrosion resistance and processability, and may be formed of an inexpensive material. For example, the slit-type nozzle 20 may be formed of a material of Incoloy 800H, Incoloy 800, SS316L, SS316, or Hastelloy.

At the lowest value (for example, 100 m/s) or more of the spraying speed of the gas, the gas is directly sprayed to the inner wall 11, the bottom 12, and the electrode cover 13 of the reactor 10 such that the silicon particles are allowed to float on the inner wall 11, the bottom 12, and the electrode cover 13 of the reactor 10 without being adsorbed, and are discharged together with the gas. The adsorption suppression effect of the silicon particles may be insignificant at the spraying speed less than 100 m/s.

In the slit-type nozzle 20, the slits S21 and S22 are formed to have the interval of less than 1 mm in order to achieve the gas spraying speed of more than 100 m/s. If the interval of the slits S21 and S22 exceeds 1 mm, the spraying speed of the gas is realized to be less than 100 m/s, and the suppression effect of the adsorption suppression of the silicon particles may be lowered.

While this invention has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

<Description of symbols>

| | |
|---|---|
| 10: CVD reactor | 11: inner wall |
| 12: bottom | 13: electrode cover |
| 14: electrode | 20, 21, 22: slit-type nozzle |
| 211: set nozzle | 212: single nozzle |
| D1, D2: distance | G1: first interval |
| G2: second interval | H1: first height |
| H2: second height | S21, S22: slit |

The invention claimed is:

1. A polysilicon manufacturing apparatus comprising:
a reactor in which a reactive gas is introduced to perform a polysilicon manufacturing process by a chemical vapor deposition (CVD) method; and a nozzle installed on a bottom of the reactor and spraying a gas inside the reactor to prevent absorption of silicon particles during a process, wherein the nozzle has a pair of slits opening in opposite directions to each other so as to spray the gas in left and right directions parallel to the bottom with a predetermined separation distance from the bottom.

2. A polysilicon manufacturing apparatus comprising:

a reactor in which a reactive gas is introduced to perform a polysilicon manufacturing process by a chemical vapor deposition (CVD) method; and a nozzle installed on an inner wall of the reactor and spraying a gas inside the reactor to prevent absorption of silicon particles during a process, wherein the nozzle has a pair of slits opening in opposite directions to each other so as to spray the gas in up and down directions parallel to the inner wall with a predetermined separation distance from the inner wall.

3. The polysilicon manufacturing apparatus of claim 2, wherein the nozzle is provided in plural on the inner wall of the reactor, and the plurality of nozzles include two nozzles forming a nozzle set and a single nozzle arranged alternately with the nozzle set along the circumference of the reactor.

4. The polysilicon manufacturing apparatus of claim 3, wherein
   one nozzle of the nozzle set is separated from a bottom of the reactor by a first height, and
   the other nozzle of the nozzle set is separated with a first interval along a height direction of the reactor from the first height.

5. The polysilicon manufacturing apparatus of claim 4, wherein
   the single nozzle is separated from the bottom by a second height that is higher than the first height and is separated with a second interval along a diagonal direction from the nozzle set.

* * * * *